(12) United States Patent
Zhang

(10) Patent No.: US 12,238,980 B2
(45) Date of Patent: Feb. 25, 2025

(54) OLED DISPLAY MODULE AND DISPLAY TERMINAL

(71) Applicant: Wuhan China Star Optoelectronics Technology Co., Ltd., Wuhan (CN)

(72) Inventor: Guiyang Zhang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/622,083

(22) PCT Filed: Dec. 9, 2021

(86) PCT No.: PCT/CN2021/136869
§ 371 (c)(1),
(2) Date: Dec. 22, 2021

(87) PCT Pub. No.: WO2023/092680
PCT Pub. Date: Jun. 1, 2023

(65) Prior Publication Data
US 2024/0298480 A1    Sep. 5, 2024

(30) Foreign Application Priority Data
Nov. 25, 2021   (CN) .......................... 202111409500.7

(51) Int. Cl.
*H10K 59/126* (2023.01)
*G06V 40/12* (2022.01)
(Continued)

(52) U.S. Cl.
CPC ....... *H10K 59/126* (2023.02); *G06V 40/1341* (2022.01); *H10K 59/38* (2023.02); *H10K 59/879* (2023.02); *H10K 2102/351* (2023.02)

(58) Field of Classification Search
CPC ...... H10K 59/126; H10K 59/40; H10K 59/38; H10K 59/879; H10K 2102/351; G06V 40/1341
See application file for complete search history.

(56) References Cited

U.S. PATENT DOCUMENTS

2019/0346939 A1    11/2019  Na et al.
2021/0376003 A1*   12/2021  Xu ..................... H10K 59/8792
(Continued)

FOREIGN PATENT DOCUMENTS

CN    104617227 A    5/2015
CN    109445161 A    3/2019
(Continued)

OTHER PUBLICATIONS

Machine language translation of CN-112882279-A (Year: 2021).*
(Continued)

*Primary Examiner* — Erik Kielin
(74) *Attorney, Agent, or Firm* — Nathan & Associates; Menachem Nathan

(57) ABSTRACT

An OLED display module and a display terminal are provided. The OLED display module includes an array base plate, a light sensor, a pixel layer, a color filter layer including a plurality of color filter sheets, a first light-shielding layer, and a second light-shielding layer. The first light-shielding layer includes at least one first light-transmissive hole. The second light-shielding layer includes at least one second light-transmissive hole. Orthographic projections of the light sensor, the first light-transmissive hole, and the second light-transmissive hole on the array base plate at least partially overlap.

20 Claims, 4 Drawing Sheets

(51) Int. Cl.
*H10K 59/38* (2023.01)
*H10K 59/80* (2023.01)
*H10K 102/00* (2023.01)

(56) References Cited

U.S. PATENT DOCUMENTS

| | | | | |
|---|---|---|---|---|
| 2022/0271103 A1* | 8/2022 | Hai | ........................ | H10K 59/40 |
| 2023/0096025 A1* | 3/2023 | Li | ..................... | H01L 27/14623 |
| | | | | 382/124 |
| 2023/0142687 A1* | 5/2023 | Ren | ........................ | H10K 59/38 |
| | | | | 257/40 |
| 2023/0165120 A1* | 5/2023 | Li | ..................... | H10K 59/8792 |
| | | | | 257/91 |

FOREIGN PATENT DOCUMENTS

| | | | | | |
|---|---|---|---|---|---|
| CN | 111563434 | A | 8/2020 | | |
| CN | 111599846 | A | 8/2020 | | |
| CN | 111668284 | A | 9/2020 | | |
| CN | 111668388 | A | 9/2020 | | |
| CN | 112216707 | A | 1/2021 | | |
| CN | 112861763 | A | 5/2021 | | |
| CN | 112882279 | A * | 6/2021 | ........... | G02F 1/1335 |
| CN | 113065445 | A | 7/2021 | | |
| CN | 113327966 | A | 8/2021 | | |
| CN | 214123368 | U | 9/2021 | | |
| CN | 113540158 | A | 10/2021 | | |
| WO | WO-2021139010 | A1 * | 7/2021 | ......... | G06V 40/1318 |
| WO | 2021174842 | A1 | 9/2021 | | |

OTHER PUBLICATIONS

Chinese Office Action issued in corresponding Chinese Patent Application No. 202111409500.7 dated Apr. 25, 2024, pp. 1-11.
International Search Report in International application No. PCT/CN2021/136869, mailed on Jul. 27, 2022.
Written Opinion of the International Search Authority in International application No. PCT/CN2021/136869, mailed on Jul. 27, 2022.

* cited by examiner

OLED DISPLAY MODULE AND DISPLAY TERMINAL

FIELD OF INVENTION

The present disclosure relates to the field of display technologies, and specifically, to an organic light-emitting diode (OLED) display module and a display terminal.

BACKGROUND OF INVENTION

In an OLED display screen, a polarizer layer is usually disposed to eliminate the impact of ambient light. However, usage of the polarizer layer, on one hand, increases costs, and on the other hand, reduces display brightness. In view of this, a low-temperature color filter technology is developed in the art. In this technology, on one hand, a color filter of a same color is made above an OLED pixel structure, to reduce the reflection impact on ambient light by a pixel electrode: and on the other hand, a black matrix is used to reduce light leakage between OLED pixels, to ensure that light emitted by the OLED pixels is only emitted through a color filter of a same color and further reduce the impact of ambient light.

However, with the advancement of display technology, increasingly more additional functional modules, such as a fingerprint recognition module, an ambient light monitoring module, and a heart rate monitoring module, are integrated into the display screen. These additional functional modules have higher requirements on design of an optical path structure of the display screen in terms of reducing the impact of ambient light.

SUMMARY OF INVENTION

Technical Problem

In a conventional OLED display screen, there is a problem that the integration with an additional functional module has higher requirements on design of an optical path structure of the display screen.

Technical Solution

The present disclosure provides an OLED display module and a display terminal, to resolve the technical problem that an additional functional module of the conventional OLED display module has higher requirements on design of an optical path structure in terms of reducing the impact of ambient light.

To resolve the foregoing technical problem, the present disclosure provides the following technical solutions:

The present disclosure provides an OLED display module, including:
an array base plate;
a light sensor, disposed on the array base plate;
a pixel layer, disposed on the array base plate, and including a plurality of sub-pixels arranged in an array;
a color filter layer, disposed on a side of the pixel layer away from the array base plate, and including a plurality of color filter sheets arranged in an array, wherein the plurality of color filter sheets are in a one-to-one correspondence with the plurality of sub-pixels;
a first light-shielding layer, disposed in an interval region between the plurality of color filter sheets, and including at least one first light-transmissive hole; and
at least one second light-shielding layer, disposed between the pixel layer and the color filter layer, and including at least one second light-transmissive hole, wherein orthographic projections of the light sensor, the first light-transmissive hole, and the second light-transmissive hole on the array base plate at least partially overlap.

In the OLED display module of the present disclosure, the first light-transmissive hole includes at least one first light-transmissive region, and the second light-transmissive hole includes at least one second light-transmissive region.

In the OLED display module of the present disclosure, orthographic projections of the first light-transmissive region, the second light-transmissive region, and the light sensor on the array base plate at least partially overlap.

In the OLED display module of the present disclosure, the OLED display module further includes a light collecting layer, and the lightcollecting layer includes at least one first microlens.

In the OLED display module of the present disclosure, the first microlens is disposed in the first light-transmissive hole.

In the OLED display module of the present disclosure, a size of the first microlens is less than or equal to a diameter of the first light-transmissive hole.

In the OLED display module of the present disclosure, the OLED display module further includes a light collecting layer, and the light collecting layer includes at least one first microlens.

In the OLED display module of the present disclosure, the first microlens is disposed between the first light-shielding layer and the second light-shielding layer.

In the OLED display module of the present disclosure, an orthographic projection of the first microlens on the first light-shielding layer at least partially overlaps with the first light-transmissive hole.

In the OLED display module of the present disclosure, a boundary line of an orthographic projection of the first microlens on the second light-shielding layer falls within the second light-shielding layer located outside the second light-transmissive hole.

In the OLED display module of the present disclosure, the light collecting layer further includes a second microlens disposed between the pixel layer and the color filter layer.

In the OLED display module of the present disclosure, an orthographic projection of the second microlens on the pixel layer at least partially overlaps with the sub-pixels.

In the OLED display module of the present disclosure, the second microlens and the first microlens are arranged in a same layer.

In the OLED display module of the present disclosure, the light collecting layer and the second light-shielding layer are arranged in a same layer.

In the OLED display module of the present disclosure, the light collecting layer is located on a side of the second light-shielding layer away from the array base plate.

In the OLED display module of the present disclosure, the OLED display module further includes an array metal layer disposed between the array base plate and the pixel layer.

In the OLED display module of the present disclosure, the light sensor is located on a side of the array metal layer close to the array base plate.

In the OLED display module of the present disclosure, the array metal layer includes a third light-transmissive hole, and an orthographic projection of the third light-transmissive hole on the first light-shielding layer at least partially overlaps with the first light-transmissive hole.

In the OLED display module of the present disclosure, the light sensor is disposed opposite to the third light-transmissive hole.

The present disclosure further provides a display terminal, including a terminal body and the foregoing OLED display module, wherein the OLED display module and the terminal body are combined into one.

Beneficial Effects

In the present disclosure, the color filter layer and the first light-shielding layer are disposed in the OLED display module instead of a polarizer, providing the effect of reducing light leakage between pixels, reducing the impact of ambient light, and reducing the thickness of the module. A touch recognition module is further disposed in the OLED display module. In the present disclosure, the first light-transmissive hole is disposed on the first light-shielding layer, and an orthographic projection of the light sensor on the first light-shielding layer is made to at least partially overlap with the first light-transmissive hole. In this way, during fingerprint recognition, light emitted by the pixel layer can reach the light sensor through the first light-transmissive hole after reflection by a finger, thereby realizing a function of fingerprint recognition. In the present disclosure, with the foregoing configuration, an optical path structure of the OLED display module can be made to match the function of fingerprint recognition, and excellent effects of preventing light leakage and reducing the reflection impact of ambient light are provided.

BRIEF DESCRIPTION OF DRAWINGS

To describe technical solutions in embodiments of the present disclosure more clearly, the following briefly introduces the accompanying drawings required for describing the embodiments. Apparently, the accompanying drawings in the following descriptions show only some embodiments of the present disclosure, and a person skilled in the art may still derive other accompanying drawings from these accompanying drawings without creative efforts.

Figure 1:
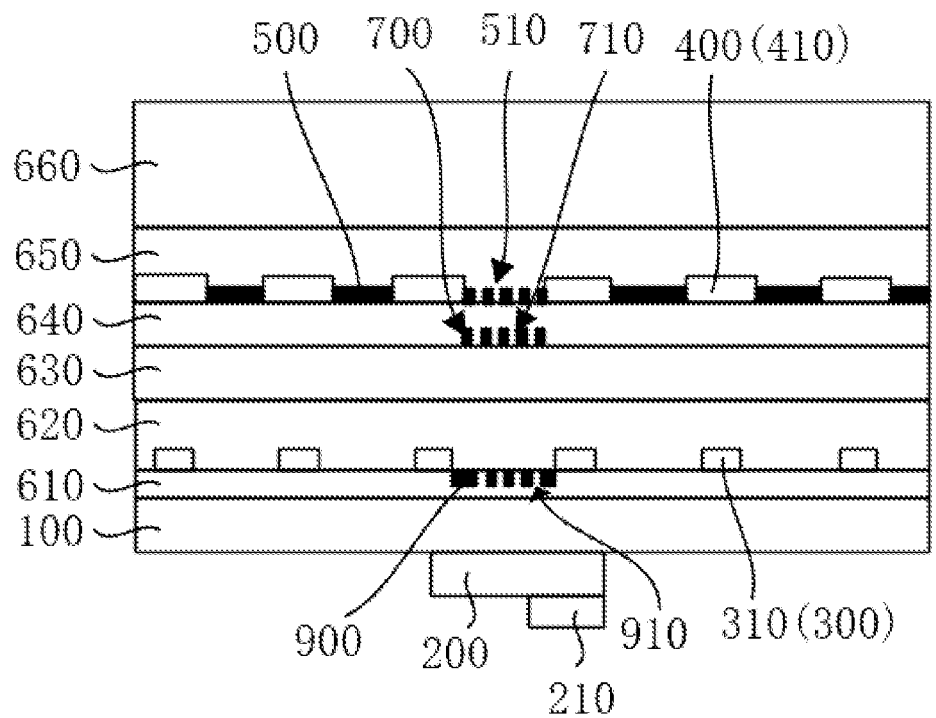
FIG. 1 is a first schematic structural diagram of an OLED display module according to the present disclosure.

Descriptions of reference numerals:

Array base plate 100; light sensor 200; touch driver chip 210; pixel layer 300; sub-pixel 310: color filter layer 400; color filter sheet 410; first light-shielding layer 500; first light-transmissive hole 510; first planarization layer 610; second planarization layer 620; package layer 630; touch panel 640; third planarization layer 650; flexible cover layer 660; second light-shielding layer 700; second light-transmissive hole 710; light collecting layer 800; first microlens 810; second microlens 820; array metal layer 900; and third light-transmissive hole 910.

EMBODIMENTS OF THE PRESENT DISCLOSURE

The technical solutions in the embodiments of the present disclosure are clearly and completely described in the following with reference to the accompanying drawings in the embodiments of the present disclosure. Apparently, the described embodiments are merely some rather than all of the embodiments of the present disclosure. All other embodiments obtained by a person skilled in the art based on the embodiments of the present disclosure without creative efforts shall fall within the protection scope of the present disclosure. In addition, it should be understood that the specific implementations described herein are merely used to describe and explain the present disclosure, and are not used to limit the present disclosure. In the present disclosure, unless otherwise stated, orientation terms such as "upper" and "lower" used herein usually refer to the upper and lower of a device in an actual application or a working state, and specifically to the drawing direction in the accompanying drawings; and "inner" and "outer" refer to the contour of the device.

A pixel electrode structure of an OLED display screen contains a metal electrode structure and a metal circuit connecting line, which strongly reflect ambient light and greatly reduce contrast. Therefore, a circular polarizer including a linear polarizer and a quarter wave plate is generally used to eliminate the impact of ambient light. However, usage of the circular polarizer, on one hand, increases costs, and on the other hand, reduces display brightness. In view of this, a low-temperature color filter technology is developed in the art. In this technology, on one hand, a color filter of a same color is made above an OLED pixel structure, to reduce the reflection impact on ambient light by a pixel electrode; and on the other hand, a black matrix is used to reduce light leakage between OLED pixels, to ensure that light emitted by the OLED pixels is only emitted through a color filter of a same color and further reduce the impact of ambient light.

However, with the advancement of display technology, increasingly more additional functional modules, such as a fingerprint recognition module, an ambient light monitoring module, and a heart rate monitoring module, are integrated into the display screen. Optical fingerprint recognition has been a standard technology of OLED. These additional functions, such as the optical fingerprint recognition technology, have higher requirements on design of an optical path structure of the display screen in terms of reducing the impact of ambient light. Based on the above technical problems, the present disclosure provides the following solutions.

Referring to FIGS. 1 to 8, the present disclosure provides an OLED display module, including:

an array base plate 100;

a light sensor 200, disposed on the array base plate 100;

a pixel layer 300, disposed on the array base plate 100, and including a plurality of sub-pixels 310 arranged in an array;

a color filter layer 400, disposed on a side of the pixel layer 300 away from the array base plate 100, and including a plurality of color filter sheets 410 arranged in an array, wherein the plurality of color filter sheets 410 are in a one-to-one correspondence with the plurality of sub-pixels 310;

a first light-shielding layer 500, disposed in an interval region between the plurality of color filter sheets 410, and including at least one first light-transmissive hole 510; and at least one second light-shielding layer 700, disposed between the pixel layer 300 and the color filter layer 400, and including at least one second light-transmissive hole 710, wherein orthographic projections of the light sensor 200, the first light-transmissive hole 510, and the second light-transmissive hole 710 on the array base plate 100 at least partially overlap.

In the present disclosure, the color filter layer 400 and the first light-shielding layer 500 are disposed in the OLED display module instead of a polarizer, providing the effect of reducing light leakage between pixels, reducing the impact of ambient light, and reducing the thickness of the module. A touch recognition module is further disposed in the OLED display module. In the present disclosure, the second light-shielding layer 700 is disposed, the first light-transmissive hole 510 is disposed on the first light-shielding layer 500, the second light-transmissive hole 710 is disposed on the second light-shielding layer 700, and the orthographic projections of the light sensor 200, the first light-transmissive hole 510, and the second light-transmissive hole 710 on the array base plate 100 are made to at least partially overlap. In this way, during fingerprint recognition, the first light-transmissive hole 510 and the second light-transmissive hole 710 form a collimation structure, so that light reaches the light sensor 200 through the first light-transmissive hole 510 and the second light-transmissive hole 710, thereby realizing a function of fingerprint recognition.

In the present disclosure, the second light-shielding layer 700 is disposed, so that ambient light can be further blocked by the second light-shielding layer 700 after being blocked by the first light-shielding layer 500, thereby further reducing the impact of ambient light. In addition, the two light-shielding layers can reduce a light intensity of emergent light of the pixel layer 300 through the first light-transmissive hole 510, thereby reducing a contrast loss.

In the present disclosure, with the foregoing configuration, an optical path structure of the OLED display module can be made to match the function of fingerprint recognition, and excellent effects of preventing light leakage and reducing the reflection impact of ambient light are provided.

The technical solutions of the present disclosure are described now with reference to specific embodiments.

In the present embodiment, the array base plate 100 may include a substrate and a thin film transistor layer disposed on the substrate, wherein the substrate may be a glass base plate.

In the present embodiment, referring to FIG. 1, FIG. 1 is a first schematic structural diagram of an OLED display module according to the present disclosure. The light sensor 200 may be disposed on a side of the array base plate 100 away from a light exit surface of the OLED display module. In this case, the light sensor 200 is externally hung under the OLED display module, and the light sensor 200 is correspondingly electrically connected to a touch driver chip 210.

Figure 2:
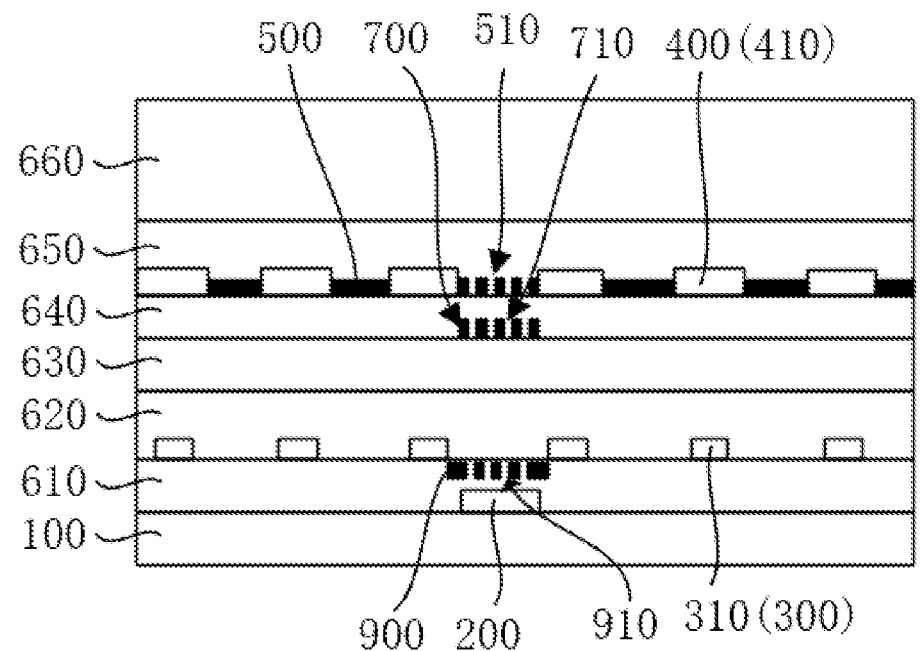
FIG. 2 is a second schematic structural diagram of an OLED display module according to the present disclosure.

In the present embodiment, referring to FIG. 2, FIG. 2 is a second schematic structural diagram of an OLED display module according to the present disclosure. The light sensor 200 may be alternatively disposed on a side of the array base plate 100 close to the light exit surface of the OLED display module. In this case, the light sensor 200 may be integrated into a driving circuit (for example, in the thin film transistor layer) or may be integrated into another layer of the OLED display module. For example, the light sensor 200 may be alternatively integrated into the pixel layer 300 (referring to FIG. 3). It should be noted that, when the light sensor 200 is integrated into the driving circuit, a display driver and a fingerprint driver may share a driver chip.

In the present embodiment, the light sensor 200 is disposed on the side of the array base plate 100 close to the light exit surface of the OLED display module. In this way, the light sensor 200 can be integrated with a layer structure of the OLED display module, thereby reducing module thickness of the OLED display module, and providing smaller overall thickness and better integration. More space can be saved for design of battery and 5G (fifth generation)/6G (sixth generation) antenna.

In the present embodiment, the plurality of sub-pixels 310 in the pixel layer 300 are arranged at intervals. The sub-pixels 310 may include a red sub-pixel (R), a green sub-pixel (G), and a blue sub-pixel (B). Alternatively, the sub-pixels 310 may include a red sub-pixel (R), a green sub-pixel (G), a blue sub-pixel (B), and a white sub-pixel (W).

Referring to FIG. 2, in the present embodiment, the color filter sheets 410 may include a red color filter sheet, a green color filter sheet, a blue color filter sheet, and a white color filter sheet, wherein colors of the color filter sheets 410 are consistent with colors of the corresponding sub-pixels 310.

In the present embodiment, orthographic projections of the sub-pixels 310 on the color filter layer 400 fall within the color filter sheets 410 corresponding to the sub-pixels 310. Preferably, areas of the color filter sheets 410 are greater than areas of the corresponding sub-pixels 310, so that light emitted by the sub-pixels 310 can pass through the color filter sheets 410 more adequately, thereby improving the display brightness and contrast.

In the present embodiment, the first light-shielding layer 500 may be disposed in black matrices in interval regions among the plurality of color filter sheets 410, and the black matrices are tightly arranged with the plurality of color filter sheets 410. Alternatively, the first light-shielding layer 500 may be alternatively a black metal layer, where a material of the black metal may be Mo, $MoO_x$, or the like. In the present embodiment, providing the first light-shielding layer 500, on one hand, can prevent or reduce the light emitted by the pixel layer 300 from being directly emitted outside through intervals of the color filter sheets 410, thereby preventing or reducing the loss of display contrast. On the other hand, interference light (such as large-angle fingerprint reflection light or ambient light) entering the light sensor 200 can be reduced, which improves sensitivity of fingerprint recognition.

In the present embodiment, an orthographic projection of the light sensor 200 on the first light-shielding layer 500 can completely cover the first light-transmissive hole 510, so that light reflected by a finger can be completely projected onto the light sensor 200 through the first light-transmissive hole 510, to improve the sensitivity of fingerprint recognition.

Figure 3:
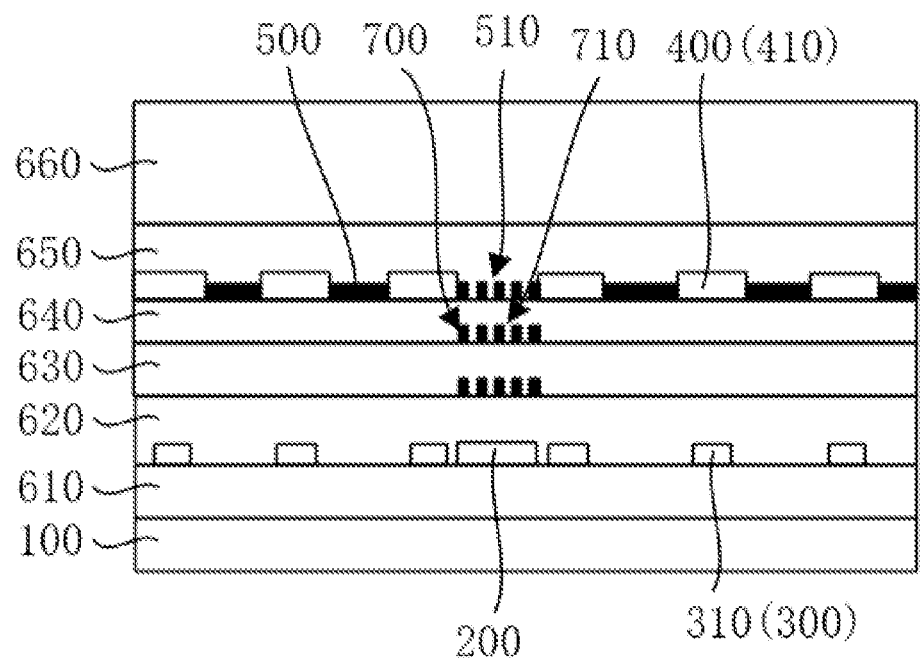
FIG. 3 is a third schematic structural diagram of an OLED display module according to the present disclosure.

Referring to FIG. 3, FIG. 3 is a third schematic structural diagram of an OLED display module according to the present disclosure. In the OLED display module of the present disclosure, the OLED display module may further include a first planarization layer 610 disposed on the array base plate 100, a second planarization layer 620 disposed on the first planarization layer 610, a package layer 630 disposed on the second planarization layer 620, a touch panel 640 disposed on the package layer 630, a third planarization layer 650 disposed on the touch panel 640, and an optical adhesive layer or/and a flexible cover layer 660 disposed on the second planarization layer 620.

In the present embodiment, the pixel layer 300 and the second planarization layer 620 may be arranged in a same layer, and the color filter layer 400 and the third planarization layer 650 may be arranged in a same layer.

In the present embodiment, the second planarization layer 620 may be made of a layer material that can transmit visible light and prevent infrared light, thereby reducing interference of ambient light.

Figure 4:
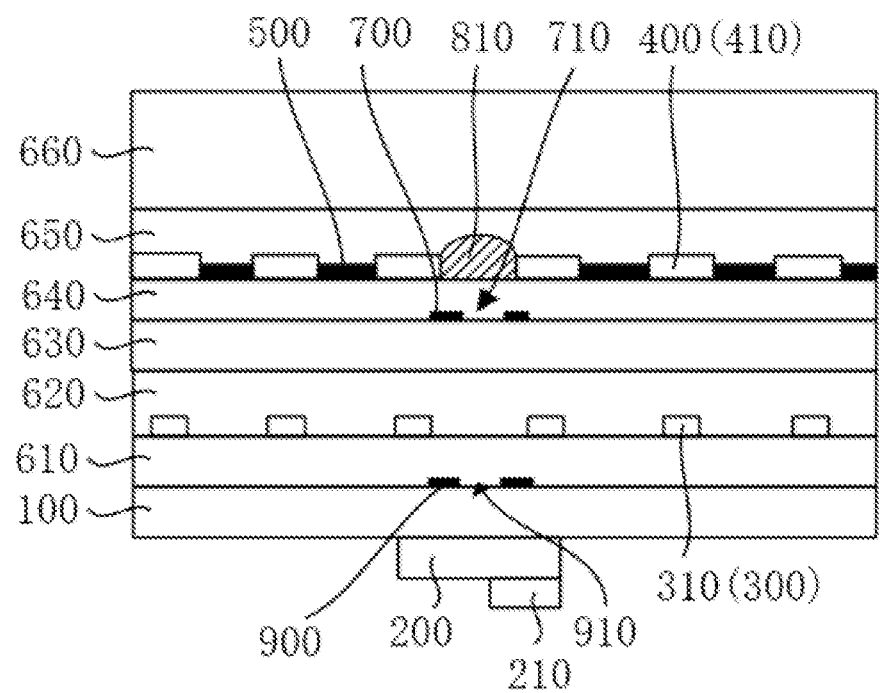
FIG. 4 is a fourth schematic structural diagram of an OLED display module according to the present disclosure.

Referring to FIG. 3 and FIG. 4, FIG. 4 is a fourth schematic structural diagram of an OLED display module according to the present disclosure. In the OLED display module of the present disclosure, the first light-transmissive hole 510 includes at least one first light-transmissive region, and the second light-transmissive hole 710 includes at least one second light-transmissive region, wherein orthographic projections of the first light-transmissive region, the second light-transmissive region, and the light sensor 200 on the array base plate at least partially overlap.

Referring to FIG. 3, in the present embodiment, the first light-transmissive hole 510 may include a plurality of first light-transmissive regions, and the second light-transmissive hole 710 may include a plurality of second light-transmissive regions. In this case, the first light-transmissive hole 510 and the second light-transmissive hole 710 are multi-hole vertical structures including a plurality of light-transmissive regions and obtained patterning processing.

Referring to FIG. 4, in the present embodiment, the first light-transmissive hole 510 may include only one first light-transmissive region, and the second light-transmissive hole 710 may include only one second light-transmissive region. In this case, the first light-transmissive hole 510 and the second light-transmissive hole 710 are complete single-hole structures. That is, in this case, the first light-transmissive region completely overlaps with the first light-transmissive hole 510, and the second light-transmissive region completely overlaps with the second light-transmissive hole 710.

In the present embodiment, when the first light-transmissive hole 510 and the second light-transmissive hole 710 are single-hole structures, a diameter of the second light-transmissive hole 710 is less than a diameter of the first light-transmissive hole 510. In the present embodiment, with the foregoing configuration, the light reflected by the finger can reach the light sensor 200 through the second light-transmissive hole 710. In addition, since the diameter of the second light-transmissive hole 710 is smaller, the second light-shielding layer 700 can further prevent ambient light from entering the inside of the OLED display module, which further reduces the impact of ambient light.

Referring to FIG. 4, in the OLED display module of the present disclosure, the OLED display module may further include a light collecting layer 800, and the light collecting layer 800 may include at least one first microlens 810. The first microlens 810 may be disposed in the first light-transmissive hole 510.

In the present embodiment, the first microlens 810, the color filter layer 400, and the third planarization layer 650 may be arranged in a same layer. A side surface of the first microlens 810 away from the pixel layer 300 may be set as a smooth convex surface, to provide a better light converging effect.

In the present embodiment, a size of the first microlens 810 on the first light-shielding layer 500 is less than or equal to the diameter of the first light-transmissive hole 510, so that the first microlens 810 can fill in the first light-transmissive hole 510, to prevent or greatly reduce light leakage at the position of the first light-transmissive hole 510.

Figure 5:
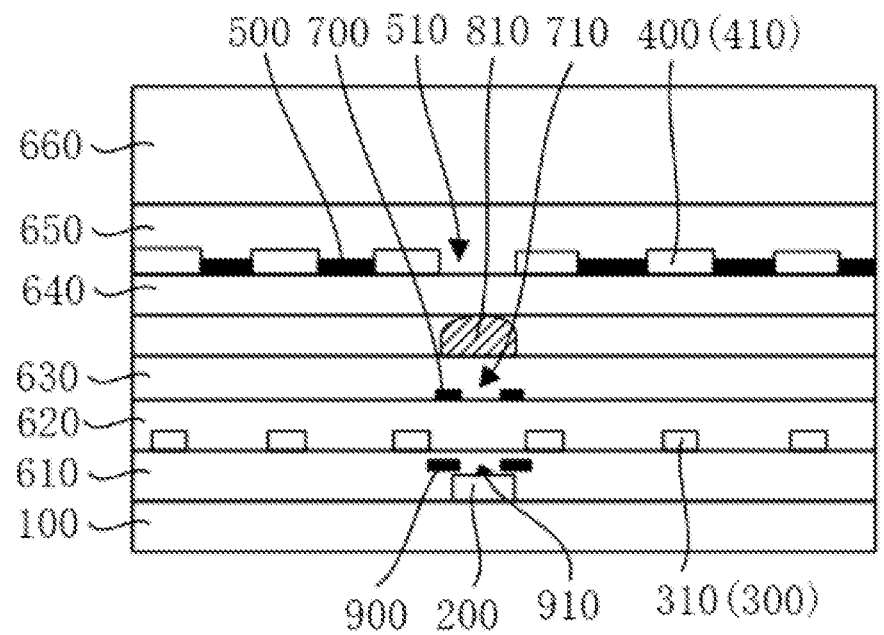
FIG. 5 is a fifth schematic structural diagram of an OLED display module according to the present disclosure.

Referring to FIG. 5, FIG. 5 is a fifth schematic structural diagram of an OLED display module according to the present disclosure. In the OLED display module of the present disclosure, the first microlens 810 may be alternatively disposed between the first light-shielding layer 500 and the second light-shielding layer 700 (as shown in FIG. 5, the first microlens 810 is disposed between the package layer 630 and the touch panel 640, and a planarization layer material is filled in a region between the package layer 630 and the touch panel 640 other than the first microlens 810), and an orthographic projection of the first microlens 810 on the first light-shielding layer 500 at least partially overlaps with the first light-transmissive hole 510.

In the present embodiment, the first microlens 810 is disposed between the first light-shielding layer 500 and the second light-shielding layer 700. On one hand, the light reflected by the finger can be refracted onto the light sensor 200 through the first microlens 810. On the other hand, ambient light passing through the first light-transmissive hole 510 can be reflected back to the outside of the OLED display module by the smooth convex surface of the first microlens 810, thereby further preventing ambient light from entering the inside of the OLED display module.

Referring to FIG. 5, in the OLED display module of the present disclosure, a boundary line of an orthographic projection of the first microlens 810 on the second light-shielding layer 700 falls within the second light-shielding layer 700 located outside the second light-transmissive hole 710.

In the present embodiment, a diameter of the orthographic projection of the first microlens 810 on the second light-shielding layer 700 is less than 30 micrometers (μm). In the present embodiment, with the foregoing configuration, ambient light reflected at an edge position of the first microlens 810 can be emitted onto the second light-shielding layer 700, thereby further preventing ambient light from reaching the light sensor 200.

Figure 6:
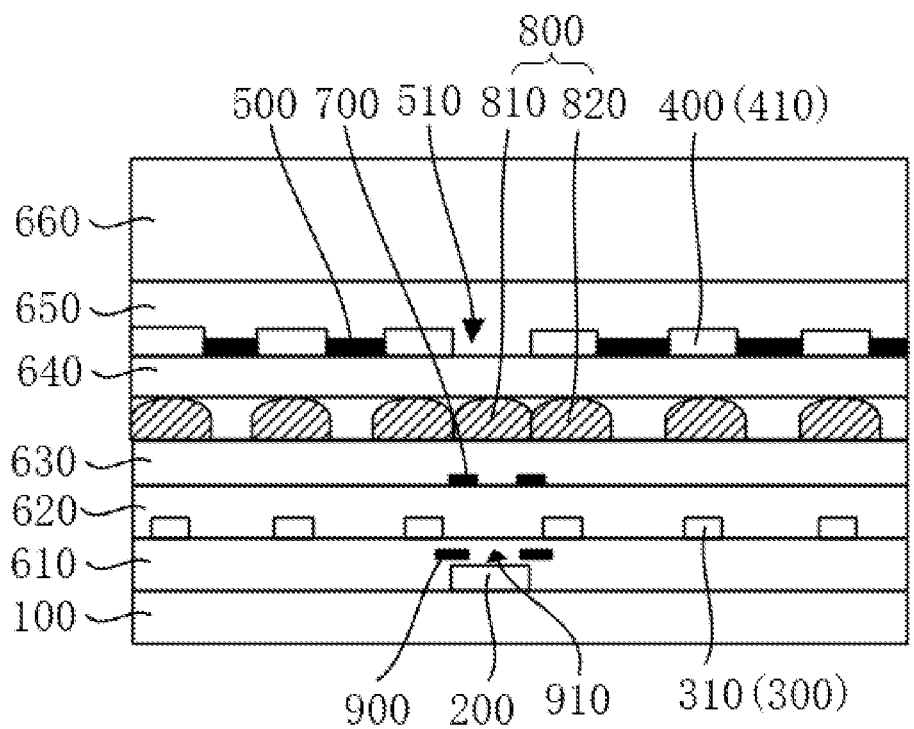
FIG. 6 is a sixth schematic structural diagram of an OLED display module according to the present disclosure.
Figure 7:
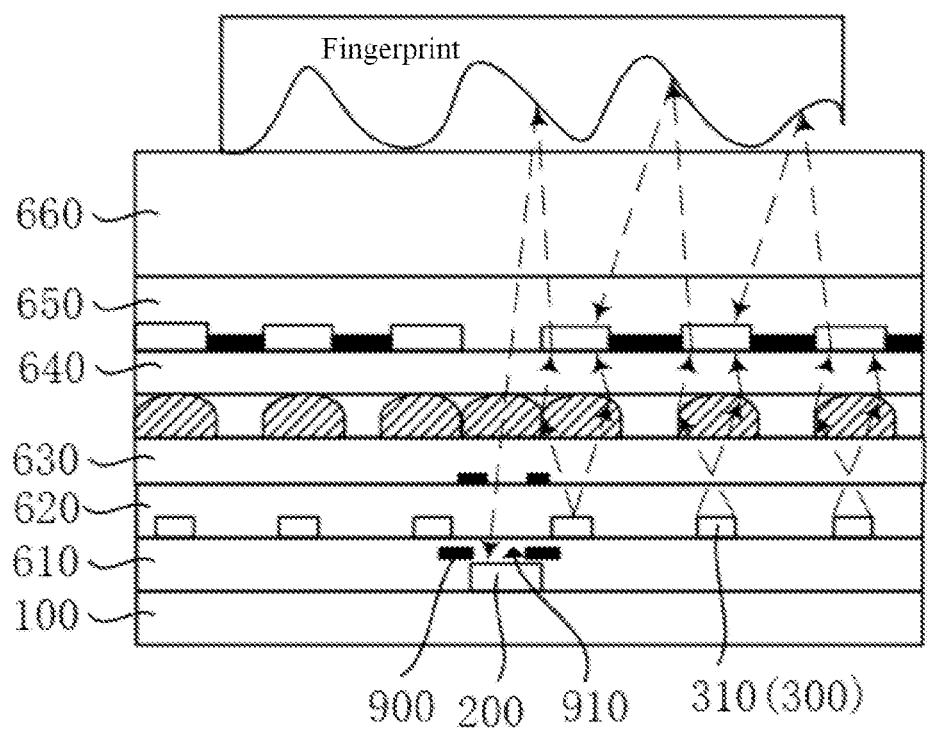
FIG. 7 is a schematic diagram of reflection of a fingerprint recognition optical path of an OLED display module according to the present disclosure.

Referring to FIG. 6 and FIG. 7, FIG. 6 is a sixth schematic structural diagram of an OLED display module according to the present disclosure, and FIG. 7 is a schematic diagram of reflection of a fingerprint recognition optical path of an OLED display module according to the present disclosure. In the OLED display module of the present disclosure, the light collecting layer 800 further includes a second microlens 820 disposed between the pixel layer 300 and the color filter layer 400. There may be a plurality of second microlenses 820. The plurality of second microlenses 820 are in a one-to-one correspondence with the plurality of sub-pixels 310 in the pixel layer 300. In this way, the second microlenses 820 can concentrate light emitted by the sub-pixels 310 to the corresponding color filter sheets 410 as much as possible, to avoid or reduce the phenomenon that a large-angle light signal is directly illuminated onto the first light-shielding layer 500 or a color filter of another color and absorbed, so that the display brightness can be further improved on the basis of implementing fingerprint recognition.

In the present embodiment, the second microlens 820 may be arranged in a same layer with any one layer of the pixel layer 300 and the color filter layer 400. A side surface of the second microlens 820 away from the pixel layer 300 may also be set as a smooth convex surface, to provide a better light collecting effect.

In the present embodiment, an orthographic projection of the second microlens 820 on the pixel layer 300 at least partially overlaps with the sub-pixels 310. Preferably, the orthographic projection of the second microlens 820 on the pixel layer 300 completely covers the sub-pixels 310 corresponding to the second microlens, thereby providing a more thorough effect of light collecting and a more obvious effect of display brightness improvement.

Referring to FIG. 6, in the OLED display module of the present disclosure, the second microlens 820 and the first microlens 810 may be arranged in a same layer. On one hand, a quantity of layers and the thickness of the OLED display module can be reduced. On other hand, the first microlens 810 and the second microlens 820 can be manufactured in a same process, thereby simplifying a process technique, and reducing manufacturing time and costs.

In the present embodiment, the first microlens 810 and the second microlens 820 may be disposed in the package layer 630. Alternatively, the package layer 630 is directly used to manufacture a microlens structure, and a planarization layer material is used to fill in a gap, to simplify a manufacturing process.

Figure 8:
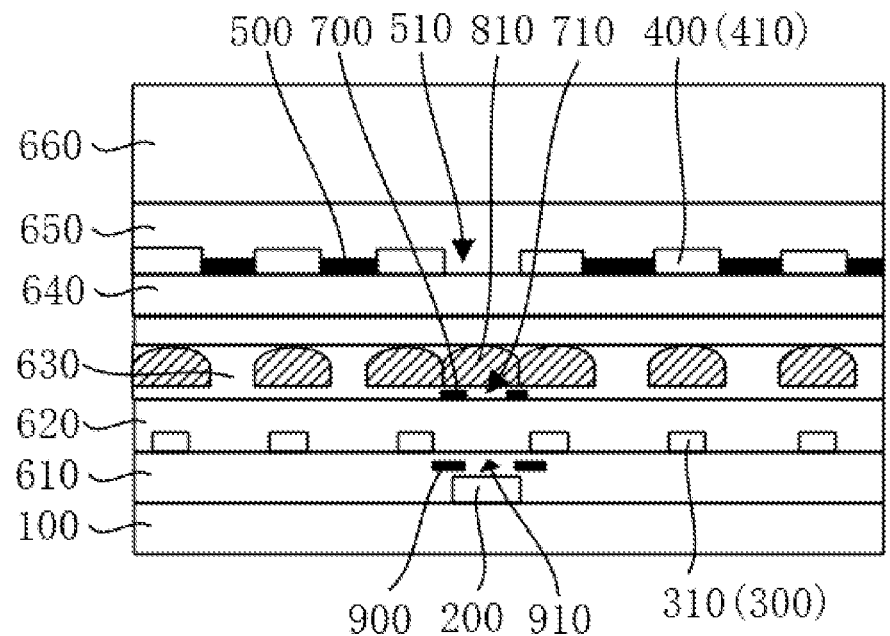
FIG. 8 is an eighth schematic structural diagram of an OLED display module according to the present disclosure.

Referring to FIG. 8, FIG. 8 is an eighth schematic structural diagram of an OLED display module according to the present disclosure. In the OLED display module of the present disclosure, the light collecting layer 800 and the second light-shielding layer 700 are arranged in a same layer, and the light collecting layer 800 is located on a side of the second light-shielding layer 700 away from the array base plate 100. In the present embodiment, the light collecting layer 800 is disposed on the side of the second light-shielding layer 700 away from the array base plate 100. Therefore, ambient light reflected by an edge of the first microlens 810 is blocked by the second light-shielding layer 700, further preventing ambient light from entering the inside of the OLED display module. In addition, in the present embodiment, the light collecting layer 800 and the second light-shielding layer 700 are arranged in the same layer. In this way, the quantity of layers of the OLED display module is further reduced, thereby reducing the thickness of the OLED display module and achieving lightness and thinness.

Referring to FIG. 8, in the OLED display module of the present disclosure, the OLED display module further includes an array metal layer 900 disposed between the array base plate 100 and the pixel layer 300. The array metal layer 900 may be arranged in a same layer with the first planarization layer 610, and the light sensor 200 is located on a side of the array metal layer 900 close to the array base plate 100.

In the present embodiment, the array metal layer 900 may include metal electrodes in a one-to-one correspondence with the sub-pixels 310 in the pixel layer 300, or may include a metal circuit connecting line used for electrically connecting the metal electrodes and the driving circuit.

In the present embodiment, the array metal layer 900 may include a third light-transmissive hole 910, the light sensor 200 is disposed opposite to the third light-transmissive hole 910, and an orthographic projection of the third light-transmissive hole 910 on the first light-shielding layer 500 at least partially overlaps with the first light-transmissive hole 510. In this way, the light signal reflected by the finger can reach the light sensor 200 through the third light-transmissive hole 910.

In the present embodiment, the third light-transmissive hole 910 may include at least one third light-transmissive region.

In the present embodiment, the third light-transmissive hole 910 may include only one third light-transmissive region. In this case, the third light-transmissive hole 910 is a complete single-hole structure. That is, in this case, the third light-transmissive region and the third light-transmissive hole completely overlap.

In the present embodiment, the third light-transmissive hole 910 may alternatively include a plurality of third light-transmissive regions. In this case, the third light-transmissive hole 910 is patterned and forms a multi-hole vertical structure with the first light-transmissive hole 510 and the second light-transmissive hole 710.

In the present embodiment, an orthographic projection of the third light-transmissive hole 910 on the light sensor 200 falls within the light sensor 200. Preferably, a diameter of the third light-transmissive hole 910 is less than a planar size of the light sensor 200. In this way, the array metal layer 900 may be used as a reflecting layer to reflect light emitted by the sub-pixels 310 back to the side of the light exit surface of the OLED display module, to reduce light linkage on a back. The array metal layer 900 may also be used as another light-shielding layer, to further block ambient light passing through the first light-transmissive hole 510 and the second light-transmissive hole 710, thereby preventing or reducing ambient light from reaching the light sensor 200, and improving the sensitivity of fingerprint recognition.

The present disclosure further provides a display terminal, including a terminal body and the OLED display module, wherein the OLED display module and the terminal body are combined into one.

In the present disclosure, the color filter layer and the first light-shielding layer 500 are disposed in the OLED display module instead of a polarizer, providing the effect of reducing light leakage between pixels, reducing the impact of ambient light, and reducing the thickness of the module. A touch recognition module is further disposed in the OLED display module. In the present disclosure, the first light-transmissive hole 510 is disposed on the first light-shielding layer 500, and the orthographic projection of the light sensor 200 on the first light-shielding layer 500 is made to at least partially overlap with the first light-transmissive hole 510. In this way, during fingerprint recognition, the light emitted by the pixel layer 300 can reach the light sensor 200 through the first light-transmissive hole 510 after reflection by a finger, thereby realizing a function of fingerprint recognition. In the present disclosure, with the foregoing configuration, an optical path structure of the OLED display module can be made to match the function of fingerprint recognition, and excellent effects of preventing light leakage and reducing the reflection impact of ambient light are provided.

An OLED display module and a display terminal provided in the embodiments of the present disclosure are described above in detail. Although the principles and implementations of the present disclosure are described by using specific examples in this specification, the descriptions of the foregoing embodiments are merely intended to help understand the method and the core idea of the method of the present disclosure. Meanwhile, a person skilled in the art may make modifications to the specific implementations and application ranges according to the idea of the present disclosure. In conclusion, the content of this specification should not be construed as a limitation on the present disclosure.

What is claimed is:

1. An organic light-emitting diode (OLED) display module, comprising:
   an array base plate;

a light sensor disposed on the array base plate;
a pixel layer disposed on the array base plate, and comprising a plurality of sub-pixels arranged in an array;
a color filter layer disposed on a side of the pixel layer away from the array base plate, wherein the color filter layer comprises a plurality of color filter sheets arranged in an array, the plurality of color filter sheets are in a one-to-one correspondence with the plurality of sub-pixels;
a first light-shielding layer disposed in an interval region between the plurality of color filter sheets, wherein the first light-shielding layer comprises at least one first light-transmissive hole;
at least one second light-shielding layer disposed between the pixel layer and the color filter layer, wherein the second light-shielding layer comprises at least one second light-transmissive hole; and
a light collecting layer, wherein the light collecting layer comprises a first microlens and a second microlens, and the second microlens is disposed between the pixel layer and the color filter layer;
wherein orthographic projections of the light sensor, the first light-transmissive hole, and the second light-transmissive hole on the array base plate at least partially overlap;
wherein an orthographic projection of the second microlens on the pixel layer at least partially overlaps with one of the sub-pixels.

2. The OLED display module as claimed in claim 1, wherein the first light-transmissive hole comprises at least one first light-transmissive region, and the second light-transmissive hole comprises at least one second light-transmissive region.

3. The OLED display module as claimed in claim 2, wherein orthographic projections of the first light-transmissive region, the second light-transmissive region, and the light sensor on the array base plate at least partially overlap.

4. The OLED display module as claimed in claim 1, wherein the first microlens is disposed in the first light-transmissive hole.

5. The OLED display module as claimed in claim 4, wherein a size of the first microlens is less than or equal to a diameter of the first light-transmissive hole.

6. The OLED display module as claimed in claim 1, wherein the first microlens is disposed between the first light-shielding layer and the second light-shielding layer.

7. The OLED display module as claimed in claim 6, wherein an orthographic projection of the first microlens on the first light-shielding layer at least partially overlaps with the first light-transmissive hole.

8. The OLED display module as claimed in claim 1, wherein a boundary line of an orthographic projection of the first microlens on the second light-shielding layer falls within the second light-shielding layer located outside the second light-transmissive hole.

9. The OLED display module as claimed in claim 1, wherein the second microlens and the first microlens are arranged in a same layer.

10. The OLED display module as claimed in claim 9, wherein the light collecting layer and the second light-shielding layer are arranged in a same layer.

11. The OLED display module as claimed in claim 10, wherein the light collecting layer is located on a side of the second light-shielding layer away from the array base plate.

12. The OLED display module as claimed in claim 1, wherein the OLED display module further comprises an array metal layer disposed between the array base plate and the pixel layer.

13. The OLED display module as claimed in claim 12, wherein the light sensor is located on a side of the array metal layer close to the array base plate.

14. The OLED display module as claimed in claim 13, wherein the array metal layer comprises a third light-transmissive hole, and an orthographic projection of the third light-transmissive hole on the first light-shielding layer at least partially overlaps with the first light-transmissive hole.

15. The OLED display module as claimed in claim 14, wherein the light sensor is disposed opposite to the third light-transmissive hole.

16. A display terminal, comprising a terminal body and an OLED display module, wherein the OLED display module and the terminal body are combined into one, and the OLED display module comprises:
an array base plate;
a light sensor disposed on the array base plate;
a pixel layer disposed on the array base plate, and comprising a plurality of sub-pixels arranged in an array;
a color filter layer disposed on a side of the pixel layer away from the array base plate, wherein the color filter layer comprises a plurality of color filter sheets arranged in an array, the plurality of color filter sheets are in a one-to-one correspondence with the plurality of sub-pixels;
a first light-shielding layer disposed in an interval region between the plurality of color filter sheets, wherein the first light-shielding layer comprises at least one first light-transmissive hole;
at least one second light-shielding layer disposed between the pixel layer and the color filter layer, wherein the second light-shielding layer comprises at least one second light-transmissive hole; and
a light collecting layer, wherein the light collecting layer comprises a first microlens and at least one second microlens, and the at least one second microlens is disposed between the pixel layer and the color filter layer;
wherein orthographic projections of the light sensor, the first light-transmissive hole, and the second light-transmissive hole on the array base plate at least partially overlap;
wherein an orthographic projection of each second microlens on the pixel layer at least partially overlaps with a corresponding one of the sub-pixels.

17. The display terminal as claimed in claim 16, wherein the first microlens is disposed in the first light-transmissive hole, and a size of the first microlens is less than or equal to a diameter of the first light-transmissive hole.

18. The display terminal as claimed in claim 16, wherein the first microlens is disposed between the first light-shielding layer and the second light-shielding layer, and an orthographic projection of the first microlens on the first light-shielding layer at least partially overlaps with the first light-transmissive hole.

19. The display terminal as claimed in claim 16, wherein the first microlens and the at least one second microlens are arranged in a same layer.

20. The display terminal as claimed in claim 16, wherein the at least one second microlens comprises a plurality of second microlenses arranged in one-to-one-correspondence with the plurality of sub-pixels, respectively.

\* \* \* \* \*